INVENTOR
HEIJI MOROSHIMA

BY Craig & Antonelli
ATTORNEYS

May 13, 1969 HEIJI MOROSHIMA 3,444,443

SEMICONDUCTOR DEVICE FOR HIGH FREQUENCY AND HIGH POWER USE

Filed Dec. 12, 1967 Sheet 2 of 3

INVENTOR

HEIJI MOROSHIMA

BY Craig & Antonelli

ATTORNEYS

INVENTOR
HEIJI MOROSHIMA

BY Craig & Antonelli

ATTORNEYS 3,444,443
SEMICONDUCTOR DEVICE FOR HIGH FREQUENCY AND HIGH POWER USE

Heiji Moroshima, Kodaira-shi, Japan, assignor to Hitachi, Ltd., Tokyo, Japan, a corporation of Japan Filed Dec. 12, 1967, Ser. No. 689,942
Claims priority, application Japan, Dec. 26, 1966, 41/84,436
Int. Cl. H01l *11/00, 15/00*
U.S. Cl. 317—235 7 Claims

ABSTRACT OF THE DISCLOSURE

A transistor specifically suitable for use in high frequency and high power operation comprising an emitter region disposed in a lattice form in a base region formed in a main surface of a silicon semiconductor substrate, said emitter region dividing the base region into many separated portions at the main surface and surrounding each of them and the surface of the semiconductor substrate being coated with an $SiO_2$ film over which a base electrode layer is provided to connect said separated plural portions together.

BACKGROUND OF THE INVENTION

(1) *Field of the invention*

This invention relates to an improvement of a semiconductor device for high frequency and high power use, and more particularly to an improvement of an overlay-type transistor having such structure that a multiplicity of diffused emitter regions are formed independently of each other in a diffused base region and an extended emitter electrode connecting each diffused emitter region is provided on an insulating protecting film coating the surface of a semiconductor substrate.

(2) *Description of the prior art*

In order to obtain a transistor suitable for use in high power work the emitter area should be enlarged. However, a mere increase of the emitter area results in such a phenomenon that the operating current of the high current transistor flows substantially in the peripheral portion of the emitter. The central portion is useless, causing a bad influence on the frequency characteristic of the transistor due to its electric capacitance. Therefore, a transistor with such structure is not suitable for use in high output and high frequency operation.

A transistor is proposed, in which the width of the emitter is narrowed and the ratio of its peripheral length to the surface area is increased. This type of transistor is adapted for high frequency and high output work. A typical example is an overlay-type transistor, wherein a plurality of relatively small emitters are separately formed in a base region, each emitter is surrounded by a base high doped region which is formed in the base region in order to decrease the base spreading resistance, and is provided with a base electrode. It is technically difficult for the base electrode to surround the periphery of each emitter completely, the base spreading resistance becomes considerably large. The formation of the high doped region, therefore, is indispensable to reduce the base spreading resistance. The process, however, is not preferable in view of the increased complexity of the manufacturing process. Moreover, the formation of a multiplicity of emitter regions requires a large base area or a large area for the base-collector junction. Accordingly, the electric capacitance between the base and the collector becomes large and causes a bad influence on the frequency characteristic of the transistor.

SUMMARY OF THE INVENTION

The object of this invention is to provide a novel semiconductor device, especially a transistor for high frequency and high output applications.

Another object of this invention is to eliminate the necessity of a high impurity diffused region which has been formed in the base region of a conventional overlay-type transistor to reduce the base spreading resistance, thereby providing a transistor for high frequency and high output being simple in structure and manufacturing process and having an excellent electrical characteristic.

According to one embodiment of this invention, a semiconductor device is provided, in which a semiconductor substrate or collector region of first conductivity type includes a base region of second conductivity type diffused therein, an emitter region having a higher concentration than that of said base and collector regions is diffused in a lattice form in the base surface region to divide the surface of the base into a multiplicity of independent regions, one principal surface of the semiconductor substrate having said regions is coated by an insulating protecting film except on the predetermined surface of base and emitter regions, and metal electrodes are provided on the exposed surface of base and emitter regions so that the electrodes cover at least one portion of said protecting film.

Namely, a transistor according to this invention is characterized by the lattice-shaped disposition of the emitter region formed in the base region.

DESCRIPTION OF THE PREFERRED EMBODIMENTS

In order to fully understand the transistor according to this invention an overlay transistor of the prior art will be first explained.

Figure 1:
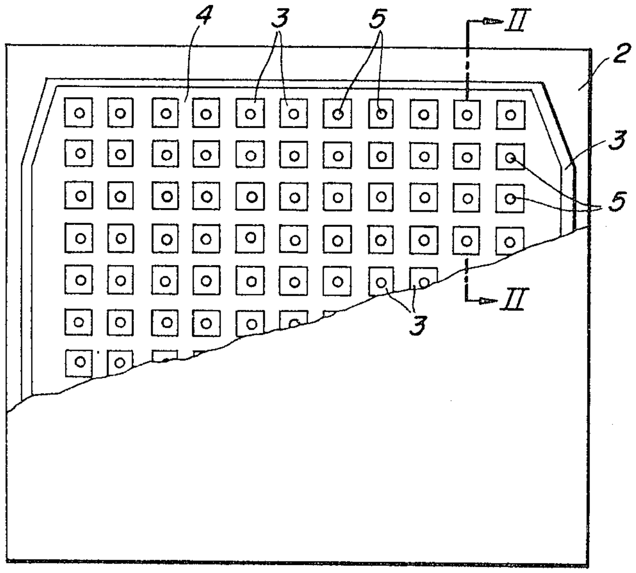
FIG. 1 PRIOR ART
FIGS. 1 and 2 are partial top and sectional views of an NPN transistor according to prior art.
Figure 2:
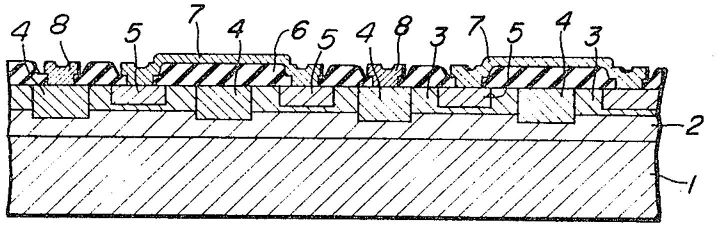
FIG. 2 PRIOR ART

FIG. 1 is a partial top view of this overlay transistor before the formation of electrodes and $SiO_2$ coating. FIG. 2 is a cross section of the transistor after the formation of electrodes as taken along the line II—II of FIG. 1. In these figures, 1 designates an N-type substrate ($N^+$ substrate) having a high impurity concentration or a low specific resistance of about 0.005 to 0.12 Ω cm., 2 an N-type high resistivity region formed epitaxially on the $N^+$ substrate 1 and having a specific resistance of 2 to 3 Ω cm., 3 a P-type base region formed by diffusion in the high resistivity region 2. 4 is a $P^+$ region formed in a lattice form in the base region 3 to supplement the base conductivity. This $P^+$ region 4 serves to reduce the spreading resistance of the base region 3. 5 shows a multiplicity of emitter regions formed independently of each other in the base region 3 in the lattice-shaped $P^+$ region 4. 6 shows an oxide film formed during the above diffusion process to cover the surface of the transistor. 7 shows an emitter electrode interconnecting emitter portions over the oxide film 6. Due to this disposition of the electrode the transistor is called an overlay transistor. 8 shows a base electrode connected with the surface of some portions of $P^+$ region 4, other portions of the $P^+$ region being covered with the oxide film and the emitter electrode 7. The characteristic of the overlay transistor thus constructed is that a multiplicity of emitter regions are formed in the base region independently of each other. The number ranges from ten to several hundred. For example, twelve and thirteen emitter regions are formed in longitudinal and lateral directions, totaling 156 emitter regions. The dimension of the substrate wafer is $540\mu$ x $440\mu$.

However, as described before, the formation of the $P^+$ region makes the manufacturing process much more complicated. Moreover, since the area of the base-collector junction can not be reduced below a certain limit, the electric capacitance of this junction causes a bad influence on the frequency characteristic.

Figure 3:
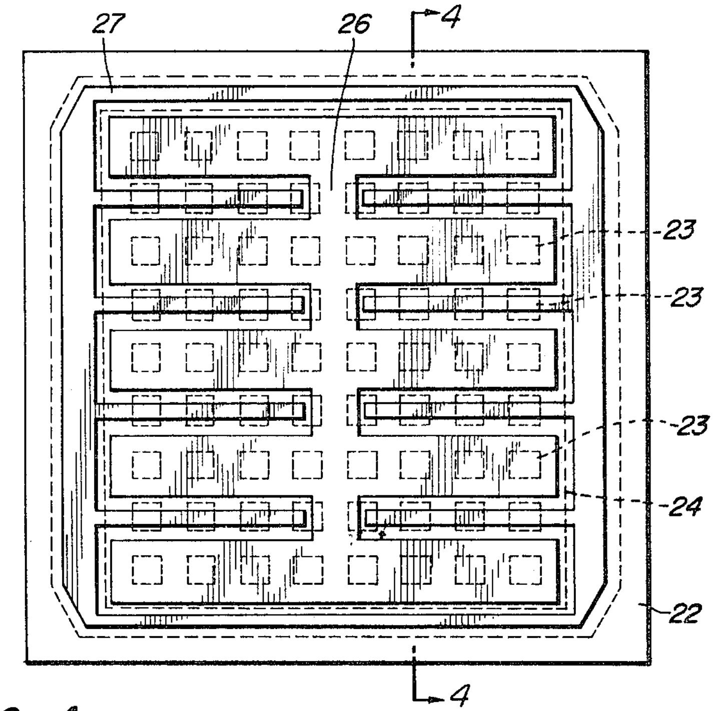
FIG. 3 is a top view of an NPN transistor for high frequency and high output work according to one embodiment of this invention.
Figure 4:
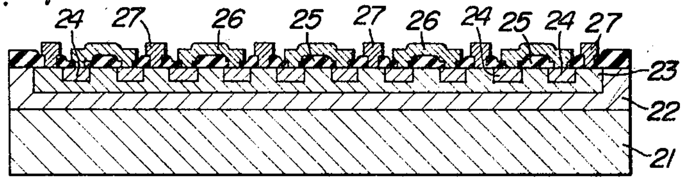
FIG. 4 is a cross sectional view taken along the line 4—4 of the transistor shown in FIG. 3.
Figure 5:
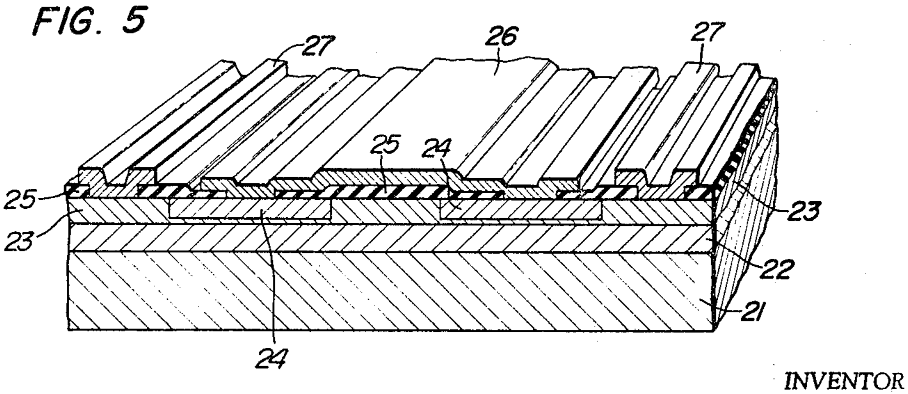
FIG. 5 is a partially enlarged perspective view of the transistor shown in FIG. 3.

Next one embodiment of this invention will be explained with reference to FIGS. 3, 4 and 5, in which like reference numerals are used to denote like parts. Although for the purpose of clarity of explanation the exemplary embodiment relates to an NPN silicon transistor, it will be understood that this invention may be applied in a similar manner to other semiconductor devices such as PNP transistors and PNPN or NPNP switching devices. The semiconductor material employed may be germanium or intermetallic compounds. In FIG. 3 PN junctions are indicated by broken lines and no insulating film is shown for the convenience of explanation. The transistor according to this embodiment comprises an N-type silicon substrate 21 having low resistivity (impurity concentration $10^{20}$ atoms/cm.$^3$), a high resistivity silicon semiconductor region 22 (impurity concentration $10^{14}$ to $10^{15}$ atoms/cm.$^3$) formed by epitaxial growth from vapor phase on one principal surface of the silicon substrate, a base region 23 of P-type conductivity (impurity concentration $10^{18}$ atoms/cm.$^3$) formed by selectively diffusing acceptor impurities like boron into the principal surface of the silicon semiconductor region, an N-type emitter region 24 (impurity concentration about $10^{20}$ atoms/cm.$^3$) formed like a lattice by the selective diffusion of phosphorus in the base region, an insulating film 25, for example an $SiO_2$ film of 5000 A. thickness, covering the principal surface of the silicon substrate and the surfaces of said other regions, an aluminum base electrode 27 disposed on the $SiO_2$ film 25 and ohmically contacting with the base region which is divided into a plurality of portions and surrounded by the emitter region, and an aluminum emitter electrode 26 mounted on the $SiO_2$ film 25 and connecting the adjacent portions of the emitter region.

In view of mass production the method of deposition by diffusion is advantageous if applied to the above diffusion process. Namely, $BBr_3$ or $PCl_3$ is introduced into a furnace with a carrier gas (for example dry oxygen) so that boron or phosphorus is deposited on a surface of a silicon wafer placed in the furnace. The unnecessarily vitrified portion is removed by etching from the deposited layer. Thereafter, heat treatment is applied above 1000° C. in an atmosphere containing wet oxygen. During the oxidation of the wafer surface the residual impurity (boron or phosphorus) is diffused into the silicon substrate. This two-stage diffusion process obviates such an undesirable situation as seen in the one-stage process that the impurity is checked to diffuse as the growth of the oxide film advances. Therefore, the impurity concentration and its distribution on the film can be conveniently controlled. According to the diffusion treatment of this embodiment, the surface impurity concentration and the thickness of the oxide film are related with each other. Their control plays an important role in the electrical characteristic of the transistor and the formation of overlay electrodes. The two-stage diffusion process, therefore, should be made carefully.

As evident from a comparison with a prior transistor, the emitter region 24 of the NPN silicon transistor according to this invention forms a lattice separating the base region 23 into many portions and surrounding them. This shape is similar to that of $P^+$ base region 4 of the prior transistor. The emitter electrode is formed so as to face every side of the base electrode. This situation is entirely opposite to that of the prior art. Further, the emitter electrode 26 and the base electrode 27 have the overlay structure.

Figure 6:
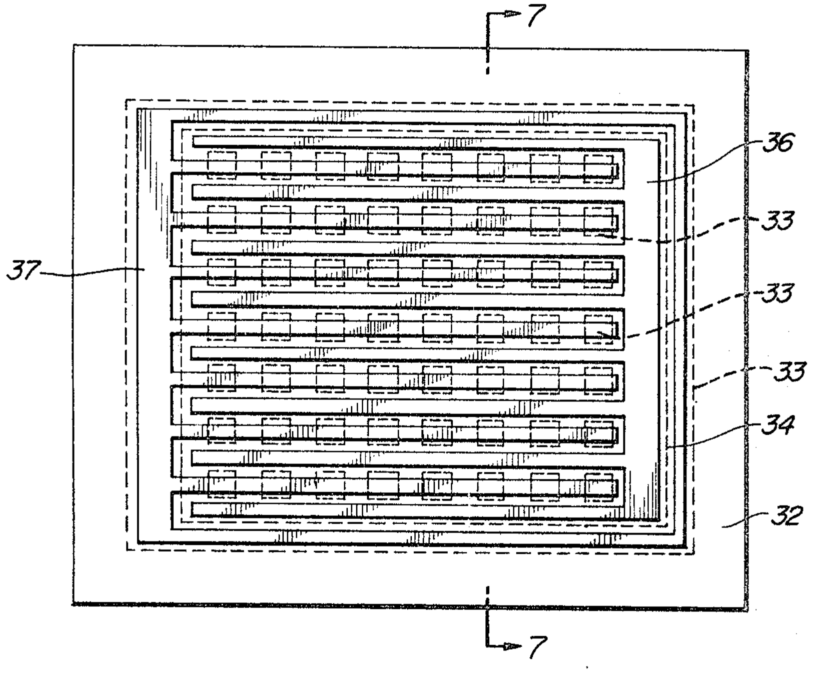
FIG. 6 is a top view of an NPN silicon transistor according to another embodiment of this invention.
Figure 7:
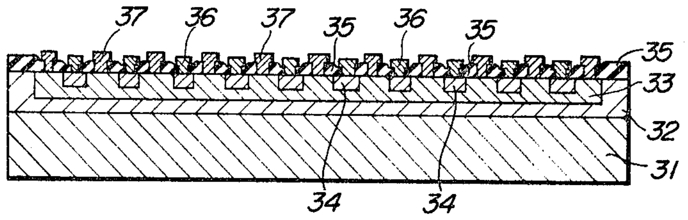
FIG. 7 is a cross sectional view taken along the line 7—7 of the transistor shown in FIG. 6.

FIGS. 6 and 7 show top and cross sectional views of a transistor according to another embodiment of this invention. The reference numerals 31, 32, 33, 34, 35, 36 and 37 correspond respectively to 21, 22, 23, 24, 25, 26 and 27 of the previous embodiment. The disposition is modified so that the base electrode 37 and emitter electrode 36 are alternately led out from the base region 33 and emitter region 34 respectively, forming stripes. If a more positive use is made of the fact that the emitter region 34 is a heavily doped region, the emitter electrode 36 may consist of one stripe or may be connected with only one portion of the emitter region 34. When the emitter electrode is thereby simplified, many separated portions of the base region can be connected with a planar electrode disposed over the $SiO_2$ film.

As apparent from the foregoing description, the inventive transistor needs no high density impurity region to supplement the base region 23 or 33. This is because the base region is completed surrounded by the emitter region and the impurity concentration of the latter ($10^{20}$ atoms/cm.$^3$) is much larger than that of the former ($10^{18}$ atoms/cm.$^3$). Further, since a multiplicity of base and emitter regions can be formed with a close distance therebetween, the base spreading resistance is not so serious. For example, the area of one portion of the base region existing in the emitter lattice 24 is about $10\mu$ x $10\mu$.

Specifically, an important aspect of the transistor described above is that each emitter portion should uniformly inject the minority carrier without concentrating the current in a particular portion. For this purpose a high resistive layer of Nichrome, etc. may be properly inserted between the base or emitter electrode and the emitter-base junction.

It is a publicly known technique to surround the base region with the emitter region by using the alloy method or the diffusion method. This technique has been applied only to the manufacture of a single element or a low frequency element, but not to that of a high frequency and high output element. Although it is difficult to satisfy both high frequency and high output characteristics, it is accomplished by a transistor of this invention. Due to the inventive lattice structure of the emitter region having a high impurity concentration the area of the base-collector junction can be decreased substantially to less than half of the prior one. This reduces the capacitance and is especially effective for a high frequency element.

The insulating protecting film covering the surface of the element is not limited to a special material. Silicon compounds other than $SiO_2$ (for example $Si_3N_4$ and phosphate-silicate glass) may also be good.

I claim:

1. A semiconductor device comprising a semiconductor substrate of a first conductivity type having a principal surface; a first semiconductive region formed in the principal surface of said substrate and having a second conductivity type opposite to the first conductivity type; a second semiconductive region of the first conductivity type formed in said first semiconductive region like a lattice dividing the principal surface of said first semiconductive region into a plurality of independent portions and surrounding each of them, the second region having a depth smaller than that of the first region, the periphery of the lattice being surrounded by said first semiconductive region; a first conductive layer connected with said second semiconductive region on the principal surface; and a second conductive layer connected with said first semiconductive region on the principal surface.

2. A semiconductor device according to claim 1, wherein an insulating film is formed on said principal surface and said second conductive layer is disposed on said insulating film such that at least one surface portion of said first semiconductive region separated and surrounded by said second semiconductive region is electrically connected to the surface portion of said first semiconductive region surrounding said second semiconductive region.

3. A semiconductor device according to claim 2, wherein said second conductive layer is disposed such that it electrically connects all of said separated portions of said first semiconductive region over said insulating film.

4. A semiconductor device according to claim 1, wherein said first conductive layer is surrounded by said second conductive layer.

5. A semiconductor device according to claim 1, wherein said semiconductor substrate forms a collector, said first semiconductive region forms a base and said second emiconductive region forms an emitter.

6. A semiconductor device according to claim 1, wherein said second conductive layer is connected to all of said independent portions of said first semiconductive regions.

7. In a transistor comprising a semiconductor substrate of a first conductivity type having a substantially plane surface, a base region formed in said substantially plane surface of said substrate and having a second conductivity type opposite to said first conductivity type, an emitter region formed in said base region and having said first conductivity type, an insulating layer covering said substantially plane surface of said substrate, a first conductive layer connected with said emitter region, and a second conductive layer connected with said base region, wherein the improvement comprises said emitter region having a plurality of apertures through which said base region protrudes to said substantially plane surface, and said second conductive layer is connected with said base region in at least some of said apertures and between said emitter region and said semiconductor substrate of said first conductivity type to surround the emitter region.

References Cited

Reprint: Electronics, August 23, 1965, the article entitled "The Overlay Transistor," part I and part II, pp. 71–84, RCA Publication No. ST–2929.

JOHN W. HUCKERT, *Primary Examiner.*

M. EDLOW, *Assistant Examiner.*

U.S. Cl. X.R.

317—234

Notice of Adverse Decisions in Interferences

In Interference No. 98,345 involving Patent No. 3,444,443, H. Moroshima, SEMICONDUCTOR DEVICE FOR HIGH FREQUENCY AND HIGH POWER USE, final judgment adverse to the patentee was rendered July 26, 1973, as to claims 2 and 3.

[*Official Gazette November 27, 1973.*]